(12) United States Patent
Dietz et al.

(10) Patent No.: US 9,500,729 B2
(45) Date of Patent: Nov. 22, 2016

(54) DOUBLE SHELL NOISE REDUCING MAGNETIC RESONANCE APPARATUS

(75) Inventors: Peter Dietz, Fürth (DE); Bernd Maciejewski, Markt Erlbach (DE); Annette Stein, Erlangen (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 912 days.

(21) Appl. No.: 13/603,492

(22) Filed: Sep. 5, 2012

(65) Prior Publication Data

US 2013/0234711 A1 Sep. 12, 2013

(30) Foreign Application Priority Data

Sep. 9, 2011 (DE) .......... 10 2011 082 410

(51) Int. Cl.
*G01R 33/38* (2006.01)
*G01R 33/28* (2006.01)

(52) U.S. Cl.
CPC .............. *G01R 33/38* (2013.01); *G01R 33/28* (2013.01)

(58) Field of Classification Search
USPC ............................. 324/300–322; 600/407–435
See application file for complete search history.

(56) References Cited

U.S. PATENT DOCUMENTS

| | | | |
|---|---|---|---|
| 5,345,177 A * | 9/1994 | Sato et al. ............... | 324/318 |
| 6,252,404 B1 | 6/2001 | Purgill et al. | |
| 6,414,489 B1 * | 7/2002 | Dean et al. .............. | 324/318 |
| 6,437,568 B1 * | 8/2002 | Edelstein et al. ........ | 324/318 |
| 6,597,174 B2 * | 7/2003 | Arz .......................... | 324/318 |
| 6,831,461 B2 * | 12/2004 | Arz ................... | G01R 33/3854 324/318 |
| 2003/0016018 A1 * | 1/2003 | Arz .......................... | 324/318 |
| 2003/0025582 A1 * | 2/2003 | Arz ................... | G01R 33/3854 335/296 |
| 2003/0088172 A1 * | 5/2003 | Kuth ................. | G01R 33/3854 600/407 |
| 2005/0040825 A1 * | 2/2005 | Sellers et al. ............. | 324/318 |
| 2009/0044212 A1 | 2/2009 | Dietz et al. | |
| 2009/0260917 A1 | 10/2009 | Maciejewski | |
| 2013/0234709 A1 * | 9/2013 | Hierl et al. ............... | 324/318 |
| 2013/0234711 A1 * | 9/2013 | Dietz et al. ............... | 324/319 |
| 2013/0234712 A1 * | 9/2013 | Dietz et al. ............... | 324/319 |
| 2013/0234713 A1 * | 9/2013 | Maciejewski et al. .... | 324/321 |
| 2014/0225616 A1 * | 8/2014 | Maciejewski ....... | G01R 33/34 324/318 |

FOREIGN PATENT DOCUMENTS

| | | |
|---|---|---|
| CN | 101796425 A | 8/2010 |
| DE | 1547085 A1 | 10/1969 |
| DE | 60032976 T2 | 11/2007 |
| DE | 102007037851 A1 | 2/2009 |
| WO | WO 2009031092 A1 | 3/2009 |

OTHER PUBLICATIONS

T. Trendelenburg et al., electronically available NPL slide presentation "Processing and Properties of Alulight Aluminum Foams and Sandwich Panels for Shipboard Applications" from Feb. 14, 2008 slides 1-37.*

* cited by examiner

*Primary Examiner* — Melissa Koval
*Assistant Examiner* — Tiffany Fetzner

(57) ABSTRACT

A magnetic resonance apparatus is proposed. The magnetic resonance apparatus has a magnet unit and a housing unit surrounding the magnet unit. The housing unit has a first housing shell unit and a second housing shell unit. The second housing shell unit is arranged between the magnet unit and the first housing shell unit.

7 Claims, 2 Drawing Sheets

Legend:
11: magnet unit
30: housing unit
31: first housing shell unit
32: second housing shell unit
33: outside surface of 11
34: distance between 31 and 32
35: distance between 32 and 11
36: side of 31 facing 32
37: side of 32 facing 31
38: side of 32 facing 11
39: double shell unit
40: first fastening unit
41: second fastening unit
42: decoupling element
43: thinckness of 32
50: housing unnit
51: sound-absorbing absorption element Legend:
11: magnet unit
30: housing unit
31: first housing shell unit
32: second housing shell unit
33: outside surface of 11
34: distance between 31 and 32
35: distance between 32 and 11
36: side of 31 facing 32
37: side of 32 facing 31
38: side of 32 facing 11
39: double shell unit
40: first fastening unit
41: second fastening unit
42: decoupling element
43: thinckness of 32
50: housing unnit
51: sound-absorbing absorption element

DOUBLE SHELL NOISE REDUCING MAGNETIC RESONANCE APPARATUS

CROSS REFERENCE TO RELATED APPLICATIONS

This application claims priority of German application No. 10 2011 082 410.3 filed Sep. 09, 2011, which is incorporated by reference herein in its entirety.

FIELD OF INVENTION

The present application relates to a magnetic resonance apparatus having a magnet unit and a housing unit surrounding the magnet unit comprising a first housing shell unit.

BACKGROUND OF INVENTION

During operation, magnetic resonance apparatuses have high noise levels which can cause discomfort for a patient located in an imaging region of the magnetic resonance apparatus for the purposes of an examination. These high noise levels are generated inside a magnet unit of the magnetic resonance apparatus. The sound waves are transmitted by a gradient system in the magnet unit to a main magnet in the magnet unit. The noise is transmitted from this main magnet to a housing unit of the magnetic resonance apparatus and from there emitted into the area surrounding the magnetic resonance apparatus.

Conventional housing units of magnetic resonance apparatuses have a single, hard-shell, such as rigid, housing shell unit made of different hard-shell shell elements. This can give rise to an unwanted gap between the individual shell elements facilitating direct sound-wave propagation in the area surrounding the magnetic resonance apparatus.

SUMMARY OF INVENTION

The present application is based on the object of providing a magnetic resonance apparatus with effective noise control. The object is achieved by the features of the independent claims. Embodiments are described in the dependent claims.

The application is based on a magnetic resonance apparatus having a magnet unit and a housing unit surrounding the magnet unit comprising a first housing shell unit.

It is proposed that the housing unit surrounding the magnet unit comprise a second housing shell unit arranged between the magnet unit and the first housing shell unit, which achieves effective noise control during the operation of the magnetic resonance apparatus. This achieves a reduction in the noise emission in an area surrounding the magnetic resonance apparatus, such as the magnet unit, which can result in a noise reduction of approximately 15 dB during the operation of the magnetic resonance apparatus. In addition, at least one of the two housing shell units can be explicitly designed for noise reduction and/or noise decoupling and the other one of the two housing shell units can be designed with respect to design aspects and/or with respect to system-dependent requirements, such as, leadthroughs or feedthroughs configured for cables and/or built-in operating elements and/or displays.

The magnet unit of the magnetic resonance apparatus comprises a main magnet for the generation of a main magnetic field, a gradient system for the generation of a location-dependent gradient field and a high-frequency unit for the generation of high-frequency signals or high-frequency pulses and the reception of magnetic resonance signals.

Noise reduction during the operation of the magnetic resonance apparatus can be achieved if the first housing shell unit and the second housing shell unit form a double shell unit surrounding the magnet unit. The double shell unit surrounds the magnet unit so that the outside of the magnet unit is covered by the double shell unit in a circumferential direction around the magnet unit.

It is also proposed that the first housing shell unit and/or the second housing shell unit comprise a substantially closed covering around the magnet unit. In this way, it is possible to create substantially continuous noise decoupling, such as sound-wave decoupling, around the magnet unit. The closed covering encloses the magnet unit so that unwanted sound-wave coupling between the magnet unit and the area surrounding the magnet unit and the housing unit is prevented. In this context, a substantially closed covering should be understood to mean a covering forming a gap-free and/or continuous covering around the magnet unit. In this case, the closed covering can comprise a plurality of individual parts, such as a plurality of shell elements joined together to form the closed covering, wherein the individual parts are joined in a gap-free and continuous manner.

In a further development of the application, it is proposed that the first housing shell unit be made of a first material and the second housing shell unit be made of a second material with the second material being at least partially different from the first material. This enables the first housing shell unit to have a material-dependent natural frequency different from a material-dependent natural frequency of the second housing shell unit and in this way unwanted resonance on the transmission of sound waves is prevented. In addition, transmission of sound waves between the two housing shell units is impeded due to the different vibration characteristics of the two housing shell units. In this case, one of the two housing shell units is formed by a conventional, rigid housing shell unit, which, is made, for example, of an SMC material (sheet molding compound) and/or a GRP material (glass-fiber reinforced plastic) and/or other materials which appear sensible to the person skilled in the art.

It is further proposed that the first housing shell unit or the second housing shell unit be at least partially flexible and has a high density thus enabling effective noise screening to be achieved by a housing shell unit embodied in this way during the operation of the magnetic resonance apparatus. In this case, the flexible housing shell unit with high density functions as a spring-mass unit, with which, due to the flexible embodiment, the housing shell unit effects decoupling between the two housing shell units on the propagation of sound waves, wherein, in addition due to the high density, the flexible housing shell unit has high mass inertia, which supports the decoupling during the propagation of sound waves. In this context, a flexible housing shell unit should be understood to mean a housing shell unit with resonance frequencies above 2000 Hz, such as above 5000 Hz. The density of the first or the second housing shell unit is formed by a surface density, wherein the surface density of the flexible material of the first or the second housing shell unit is at least 3 kg/m$^2$ and at least 5 kg/m$^2$ to 8 kg/m$^2$.

The flexible housing shell unit is made at least partially of a PVC material and/or an EPDM material and/or a silicone material. In this case, a PVC material should be understood to mean a plastic material made of a polyvinyl chloride. An EPDM material should be understood to mean an ethylene-propylene-diene rubber material. In addition, the elastic element can also comprise other flexible materials that appear sensible to the person skilled in the art. The embodiment according to the application can achieve screening of sound waves and/or decoupling of sound waves inside the housing unit. In this case, the flexible housing shell unit can be made of a film and/or mat, such as, for example, a soft-foam film and/or a heavy-weight mat, wherein a film thickness can be approximately 1.5 mm to 5.5 mm.

For effective sound-wave decoupling, it is featured for the first housing shell unit and the second housing shell unit to be arranged along a radial direction at a distance to each other around the magnet unit. A distance between the first housing shell unit and the second housing shell unit is at least 3 cm, such as at least 5 cm or at least 10 cm. In this case, a distance between the individual housing shell units is set with respect to noise decoupling and with respect to compactness of the magnetic resonance apparatus, wherein in this case, halving the distance results in the almost doubling of a sound pressure.

It is further proposed that a distance between an outside surface the magnet unit and the second housing shell unit be at least 3 cm so that effective noise decoupling of sound waves during the operation of the magnetic resonance apparatus can be achieved. However, the distance between the outside surface of the magnet unit and the second housing shell unit is at least 5 cm or at least 10 cm.

It can also be provided that the housing unit comprises at least one sound-absorbing absorption element arranged between the second housing shell unit and the first housing shell unit and/or the second housing shell unit and the magnet unit. In this case, additional sound-wave decoupling between the second housing shell unit and the first housing shell unit and/or the magnet unit can be achieved in that, a sound-absorbing absorption element made of a sound-absorbing material, a foam material and/or a non-woven material and/or an amorphous material and/or further materials that appear sensible to the person skilled in the art is used. In this context, a sound-absorbing element should be understood to mean an absorption element which is specially designed to convert sound energy of sound waves into vibration energy of inaudible vibration waves and accordingly to reduce or prevent reflection of audible sound waves at an interface. In this case, the sound waves, such as airborne sound waves, excite individual particles, such as, foam particles, of the absorption element to vibration, wherein vibration energy generated inside the absorption element is converted into thermal energy. In this way, vibration energy is extracted from the sound waves, such as the airborne-sound waves and the airborne sound waves, are attenuated. The thickness of the absorption element can be 3 mm in a spring function of the absorption element and have a thickness of up to 20 mm in an absorber function of the absorption element.

It is further proposed that the first housing shell unit be mounted at least partially sound-wave decoupled, such as structure-borne-sound-wave decoupled, from the second housing shell unit, thus enabling direct transmission of sound waves, such as structure-borne sound waves, from the second housing shell unit to the first housing shell unit to be reduced and/or prevented. In this case, it is possible, to prevent a structure-borne sound wave transmitting connection, such as a mechanically rigid connection, between the first housing shell unit and the second housing shell unit by a structure-borne sound wave-decoupled suspension of the first housing shell unit and/or the second housing shell unit.

A sound-wave decoupled arrangement of the first housing shell unit arranged sound wave-decoupled from the second housing shell unit can be achieved if the housing unit of the magnetic resonance apparatus comprises a first fastening unit for fastening the first housing shell unit and a second fastening unit for fastening the second housing shell unit, wherein the first fastening unit is arranged at least partially sound-wave decoupled from the second fastening unit.

It is further proposed that the housing unit comprise at least one decoupling element for sound-wave decoupled mounting of the first housing shell unit on the second housing shell unit. For this, it is possible to use only one fastening unit for both housing shell units and thus achieve a compact and weight-saving housing unit. The at least one decoupling element is formed by an elastic decoupling element, such as, a decoupling element made of a Sylomer pad. Alternatively or additionally, other decoupling elements made of other materials which reduce and/or suppress the propagation of sound waves are conceivable.

BRIEF DESCRIPTION OF THE DRAWINGS

Features and details of the application may be derived from the embodiment described below and with reference to the drawings. The drawings show.

DETAILED DESCRIPTION OF INVENTION

Figure 1:
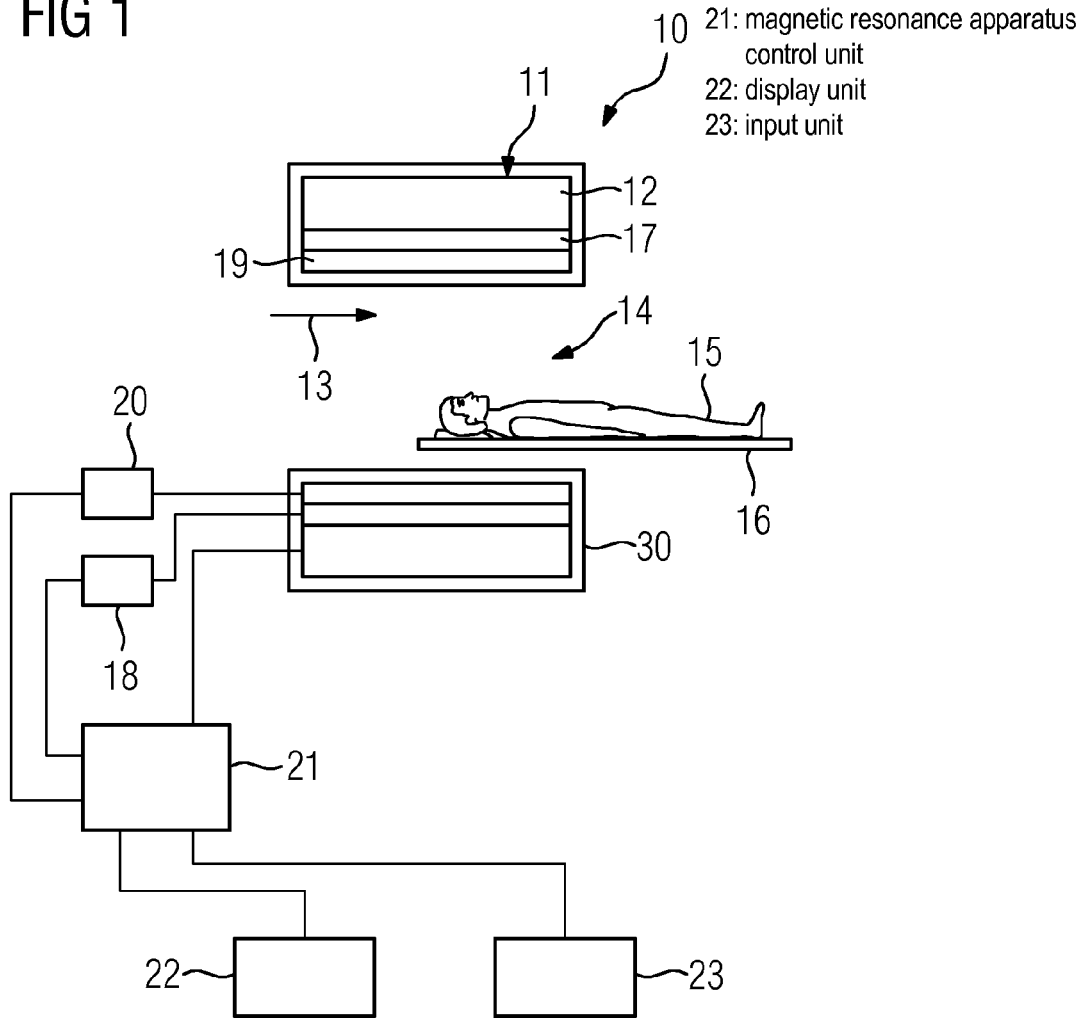
FIG. 1 a schematic representation of a magnetic resonance apparatus according to the application FIG. 2 a housing unit of the magnetic resonance apparatus having a first housing shell unit and a second housing shell unit and FIG. 3 an alternative embodiment of the housing unit to that shown in FIG. 2.

FIG. 1 is a schematic representation of a magnetic resonance apparatus 10 according to the application. The magnetic resonance apparatus 10 comprises a magnet unit 11 having a main magnet 12 for the generation of a strong and constant main magnetic field 13. In addition, the magnetic resonance apparatus 10 comprises a cylindrical imaging region 14 for accepting a patient 15, wherein the imaging region 14 is enclosed in a circumferential direction by the magnet unit 11. Alternatively to this, the imaging region 14 can also be U-shaped.

The patient 15 can be pushed into the imaging region 14 by a patient bed 16 in the magnetic resonance apparatus 10. For this, the patient bed 14 is arranged movably inside the magnetic resonance apparatus 10. The magnetic resonance apparatus 10 also comprises a housing unit 30 surrounding the magnet unit 11.

The magnet unit 11 also comprises a gradient coil 17 for generating magnetic field gradients used for spatial encoding during imaging. The gradient coil 17 is controlled by a gradient control unit 18. The magnet unit 11 also comprises a high-frequency antenna 19 and a high-frequency antenna unit 20 for the excitation of polarization, which is established in the main magnetic field 13 generated by the main magnet 12. The high-frequency antenna 19 is controlled by the high-frequency antenna unit 20 and emits high-frequency magnetic resonance sequences into an examination area which is substantially formed by the imaging region 14. This deflects the magnetization out of its equilibrium position. In addition, the high-frequency antenna unit 20 receives magnetic resonance signals.

To control the main magnet 12, the gradient control unit 18 and the high-frequency antenna unit 20, the magnetic resonance apparatus 10 comprises a control unit 21 formed by a processing unit. The processing unit controls the magnetic resonance apparatus 10 centrally, such as, the performance of a predetermined imaging gradient echo sequence. Control information, imaging parameters, and reconstructed magnetic resonance images can be displayed to an operator of the magnetic resonance apparatus 10 on an display unit 22, or on at least one monitor. The magnetic resonance apparatus 10 also comprises an input unit 23, which an operator can use to input information and/or parameters during a measuring process.

The magnetic resonance apparatus 10 shown may naturally comprise further components that magnetic resonance apparatuses 10 normally feature. The way in which a magnetic resonance apparatus 10 generally functions is also known to the person skilled in the art and no detailed description of the general components will thus be given.

Figure 2:
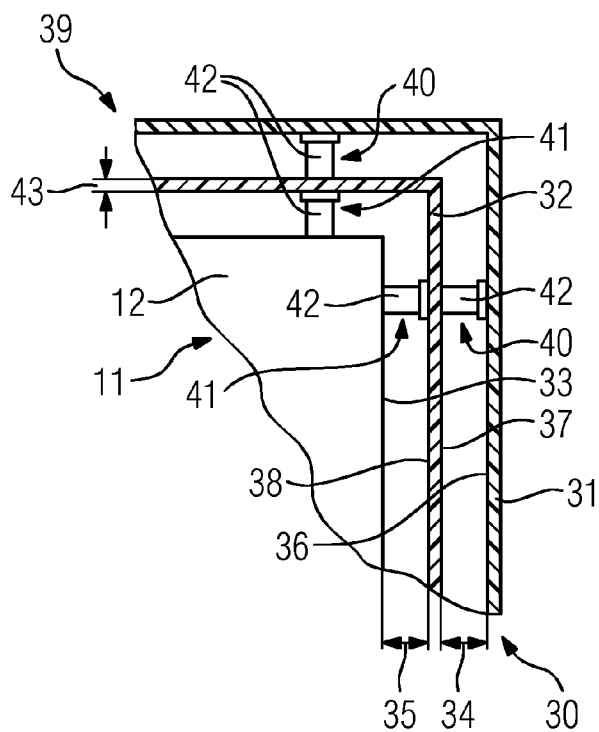

FIG. 2 shows a partial section of an arrangement of the housing unit 30 surrounding the magnet unit 11. The housing unit 30 comprises a first housing shell unit 31 and a second housing shell unit 32. The second housing shell unit 32 is arranged between the magnet unit 11 and the first housing shell unit 31 along a shortest distance between the magnet unit 11 and the first housing shell unit 31.

In this case, the second housing shell unit 32 is both spaced apart from the first housing shell unit 31 and spaced apart from an outside surface 33 of the magnet unit 11. The greater the distance 34, 35 of the second housing shell unit 32 from the first housing shell unit 31 and/or the magnet unit 11, the more effective the noise decoupling, such as sound-wave decoupling, between the magnet unit 11 and the first housing shell unit 31 can be. Doubling of the distance 34, 35 between the second housing shell unit 31 and the first housing shell unit 31 and/or the magnet unit 11 results in the approximate halving of the sound pressure. In this case, sound pressure means pressure fluctuations of a compressible sound transmission medium, including air, which occurs on the propagation of sound waves.

The distance 34 between the first housing shell unit 31, such as a side 36 of the first housing shell unit 31 facing the second housing shell unit 32, and the second housing shell unit 32, such as a side 37 of the second housing shell unit 32 facing the first housing shell unit 31 is at least 3 cm, such as 5 cm or 10 cm. In addition, the distance 35 between the second housing shell unit 32, such as a side 38 of the second housing shell unit 32 facing the magnet unit 11, and the magnet unit 11, such as the outside surface 33 of the magnet unit 11 facing the second housing shell unit 32 is at least 3 cm, such as 5 cm or 10 cm.

In this case, the first housing shell unit 31 and the second housing shell unit 32 form a double shell unit 39 surrounding or enclosing the magnet unit 11. In this case, the second housing shell unit 32 encloses the magnet unit 11 and the first housing shell unit 31 encloses the second housing shell unit 32 and the magnet unit 11. In this case, the second housing shell unit 32 comprises a closed covering the magnet unit 11 which has no opening for cables and/or other supply leads.

The first housing shell unit 31 is in this case formed by a rigid, conventional housing shell unit 31 made of a hard material with a high degree of rigidity, including SMC (sheet molding compound) material and/or a GRP (glass-fiber reinforced plastic)-material and/or other materials that appear sensible to the person skilled in the art. The first housing shell unit 31 is rigid. By contrast, the second housing shell unit 32 is made of a second, flexible material which is different from the material of the first housing shell unit 31. The thickness 43 of the second housing shell unit 32, which is, made of a flexible film can be approximately 3 to 5 mm.

A weight or a density, such as a surface density, of the second housing shell unit 32 is in this case set with respect to an overall weight of the magnetic resonance apparatus 10. Although, a high surface density can achieve sound-wave absorption behavior of the second housing shell unit, this markedly increases the overall weight of the magnetic resonance apparatus due to the large area of the second housing shell unit. For sound-wave decoupling while retaining a low housing weight, the flexible material of the second housing shell unit 32 has a high density, such as a high surface density, of at least 3 kg/m2, or a surface density of at least 5 kg/m2 to 8 kg/m2. In this case, the flexible material is formed from a PVC material and/or an EPDM material and/or a silicone material and/or other flexible materials that appear sensible to the person skilled in the art, which also suppress the propagation of sound waves.

The embodiment of the housing unit 30 with the first housing shell unit 31 made of the first material and with the second housing shell unit 32 made of the second material which is different from first material causes sound-wave transmission from the second housing shell unit 32 to the first housing shell unit 31 to be different due to different material-dependent natural frequencies being suppressed. In this way, the housing shell units 31, 32 of the housing unit 30 are made of different materials and contribute to effective noise reduction. In this case, the noise reduction can be up to 15 dB.

In an alternative embodiment of the application, it is also conceivable for the first housing shell unit 31 to be flexible and the second housing shell unit 32 to comprise a stiff and rigid housing shell when screening the magnet unit 11 from the outside. In addition, the first housing shell unit 31 can comprise a rigid and stiff housing lining on a front side and/or on a rear side of the magnetic resonance apparatus 10, while side areas of the magnetic resonance apparatus 10 can be covered by a cladding material or cladding film. In addition, the surface density of the second housing shell unit 32 can also be higher than 8 kg/m2 by inclusions of lead elements or lead balls inside the flexible housing shell unit 32 so that absorption behavior is achieved with respect to sound waves.

For fastening the first housing shell unit 31 and the second housing shell unit 32, the first housing shell unit 31 is mounted sound-wave decoupled from the second housing shell unit 32. In this case, the housing unit 30 comprises a first fastening unit 40 for fastening the first housing shell unit 31 and a second fastening unit 41 for fastening the second housing shell unit 32. The two fastening units 40, 41 are hereby arranged sound-wave decoupled from each other inside the housing unit 30 on the magnet unit 11. For the sound-wave decoupled arrangement of the two housing shell units 31, 32 from each other and from the magnet unit 11, the housing unit 30 comprises a plurality of decoupling elements 42, which are formed from Sylomer pads and/or further sound-wave decoupled materials that appear sensible to the person skilled in the art. The decoupling elements 42 facilitate sound-wave decoupled mounting of the first and the second housing shell unit 31, 32 from each other.

Alternatively, to this, it can also be provided that the first fastening unit 40 is arranged in a contactless manner around the magnetic resonance apparatus 10, such as the second housing shell unit 32 and the magnet unit 11, by utilizing a separate support rack, which is arranged around the magnet unit 11 and the second housing shell unit 32 separately on a support surface, or a base for mounting the magnetic resonance apparatus 10. On this separate support rack, the first housing shell unit 31 can be fastened at a distance around the second housing shell unit 32.

The housing unit 30 having the first housing shell unit 31 and the second housing shell unit 32 and the two fastening units 40, 41 is magnetic resonance compatible.

Figure 3:
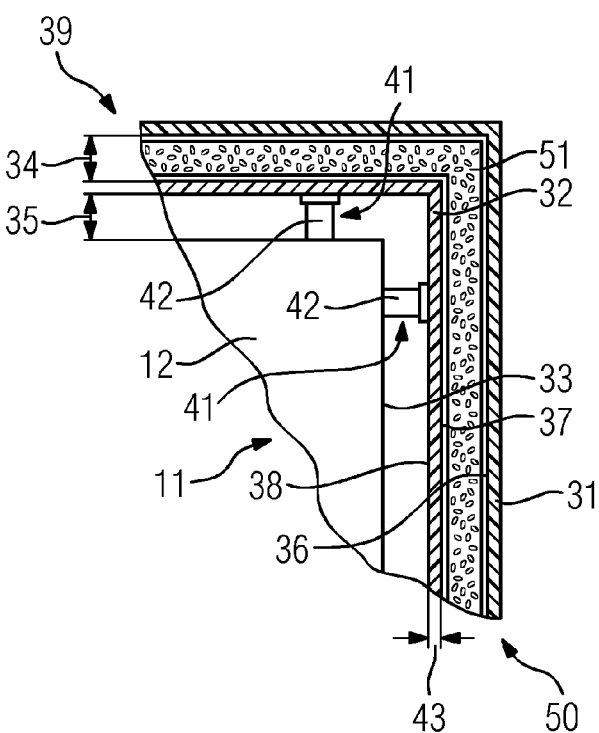

FIG. 3 shows an alternative embodiment of the housing unit 50. Substantially the same components, features and functions are given the same reference numbers. The following description is substantially restricted to the differences from the embodiment in FIG. 2, wherein reference is made to the description of the embodiment in FIG. 2 with respect to identical components, features and functions.

In FIG. 3 shows a housing unit 50 having a first housing shell unit 31 and a second housing shell unit 32. In this case, the embodiment of the two housing shell units 31, 32 and their arrangement with respect to each other or their arrangement with respect to the magnet unit 11 correspond to the explanations for FIG. 2. However, the housing unit 50 in FIG. 3 comprises a sound-absorbing absorption element 51 arranged between the second housing shell unit 32 and the first housing shell unit 31. The sound-absorbing absorption element 51 is made of a sound-absorbing material, which may be sound-absorbing foam and/or a sound-absorbing non-woven material etc. This can achieve additional noise reduction during the operation of the magnetic resonance apparatus 10.

Alternatively to this, the second, flexible housing shell unit 32 can also comprise a soft foam, which is knobbly on the side facing the first housing shell unit 31 and by which an area between the first housing shell unit 31 and the second housing shell unit 32 is at least partially filled so that the sound-absorbing absorption element 51 is at least partially contained by the second, flexible housing shell unit 32. It is also conceivable for the sound-absorbing absorption element 51 to be arranged between the second housing shell unit 32 and the magnet unit 11.

The invention claimed is:

1. A magnetic resonance apparatus that effectively noise decouples noise during magnetic resonance, comprising:
    a magnet unit; and
    a double shell housing unit surrounding an outside of the magnet unit in a circumferential direction around the magnet unit, wherein the double shell housing unit comprises:
    a first housing shell unit, and
    a second housing shell unit arranged between the magnet unit and the first housing shell unit,
    wherein the first housing shell unit is made of a first material and the second housing shell unit is made of a second material, and wherein a surface density of the second material is different from a surface density of the first material,
    wherein a distance between a side of the first housing shell unit facing the second housing unit and a side of the second housing shell unit facing the first housing shell unit is at least 3 cm,
    wherein a distance between an outside surface of the magnet unit and the second housing shell unit is at least 3 cm, and
    wherein the first housing shell unit and/or the second housing shell unit comprises a closed covering around the magnet unit permitting continuous noise decoupling around the magnetic unit.

2. The magnetic resonance apparatus as claimed in claim 1, wherein the first housing shell unit or the second housing shell unit is flexible and has a high density of at least 3 kg/m2 or at least 5 kg/m2 or approximately 8 kg/m$^2$.

3. The magnetic resonance apparatus as claimed in claim 2, wherein the first housing shell unit or the second housing shell unit is made at least partially from a PVC material and/or an EPDM material and/or a silicone material.

4. A The magnetic resonance apparatus as claimed in claim 1, wherein the double shell housing unit comprises at least one sound-absorbing absorption element arranged inside an area between the second housing shell unit and the first housing shell unit and/or between the second housing shell unit and the magnet unit.

5. The magnetic resonance apparatus as claimed in claim 1, wherein the first housing shell unit is mounted so that it is at least partially sound-wave decoupled from the second housing shell unit by using elastic decoupling elements.

6. The magnetic resonance apparatus as claimed in claim 1, wherein the double shell housing unit comprises a first fastening unit configured for fastening the first housing shell unit and a second fastening unit configured for fastening the second housing shell unit, and wherein the first fastening unit is arranged so that it is at least partially sound-wave decoupled from the second fastening unit by using elastic decoupling elements.

7. The magnetic resonance apparatus as claimed in claim 5, wherein the elastic decoupling elements comprise Sylomer pads.

* * * * *